US012607661B2

(12) United States Patent
Meyer et al.

(10) Patent No.: US 12,607,661 B2
(45) Date of Patent: Apr. 21, 2026

(54) SIMULTANEOUS MULTI-BAND RYDBERG RECEIVER/SENSOR

(71) Applicant: U.S. Army DEVCOM, Army Research Laboratory, Adelphi, MD (US)

(72) Inventors: David H. Meyer, Burtonsville, MD (US); Joshua C. Hill, Silver Spring, MD (US); Kevin C. Cox, Gate City, VA (US); Paul D. Kunz, Austin, TX (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 255 days.

(21) Appl. No.: 18/233,905

(22) Filed: Aug. 15, 2023

(65) Prior Publication Data

US 2025/0060400 A1      Feb. 20, 2025

(51) Int. Cl.
  *G01R 29/08*          (2006.01)
(52) U.S. Cl.
  CPC ................................. *G01R 29/0885* (2013.01)
(58) Field of Classification Search
  CPC .................................................. G01R 29/0885

USPC .......................................................... 324/97
See application file for complete search history.

(56) References Cited

U.S. PATENT DOCUMENTS

| | | | |
|---|---|---|---|
| 10,763,966 B1 * | 9/2020 | Deb ................. | H04B 10/25759 |
| 11,360,135 B2 * | 6/2022 | Anderson .......... | G01R 29/0878 |
| 11,681,016 B1 * | 6/2023 | Bohaichuk .............. | G01S 17/88 |
| | | | 342/195 |
| 2009/0295405 A1 * | 12/2009 | Pommerenke ..... | G01R 29/0878 |
| | | | 324/627 |
| 2020/0292606 A1 * | 9/2020 | Holloway .......... | G01R 29/0892 |
| 2021/0270882 A1 * | 9/2021 | Imhof ...................... | G01R 5/34 |
| 2021/0405136 A1 * | 12/2021 | Arroyo Camejo ... | G01R 33/323 |

* cited by examiner

*Primary Examiner* — Christopher P McAndrew
(74) *Attorney, Agent, or Firm* — Alan I. Kalb

(57) ABSTRACT

Electric field sensors based on Rydberg atoms and their unique capabilities, relative to traditional sensors, are used for detecting radio frequency (RF) signals. Simultaneous demodulation and detection of multiple RF tones spanning nearly two decades (six octaves) are provided. The continuous recovery of the phase and amplitude of each tone and the sensitivity of the system and its bandwidth capabilities for multiband detection are provided. A digital communication protocol is also provided that simultaneously receives on-off-keyed binary data from four bands spanning nearly one decade of frequency.

20 Claims, 13 Drawing Sheets

FIG. 2A

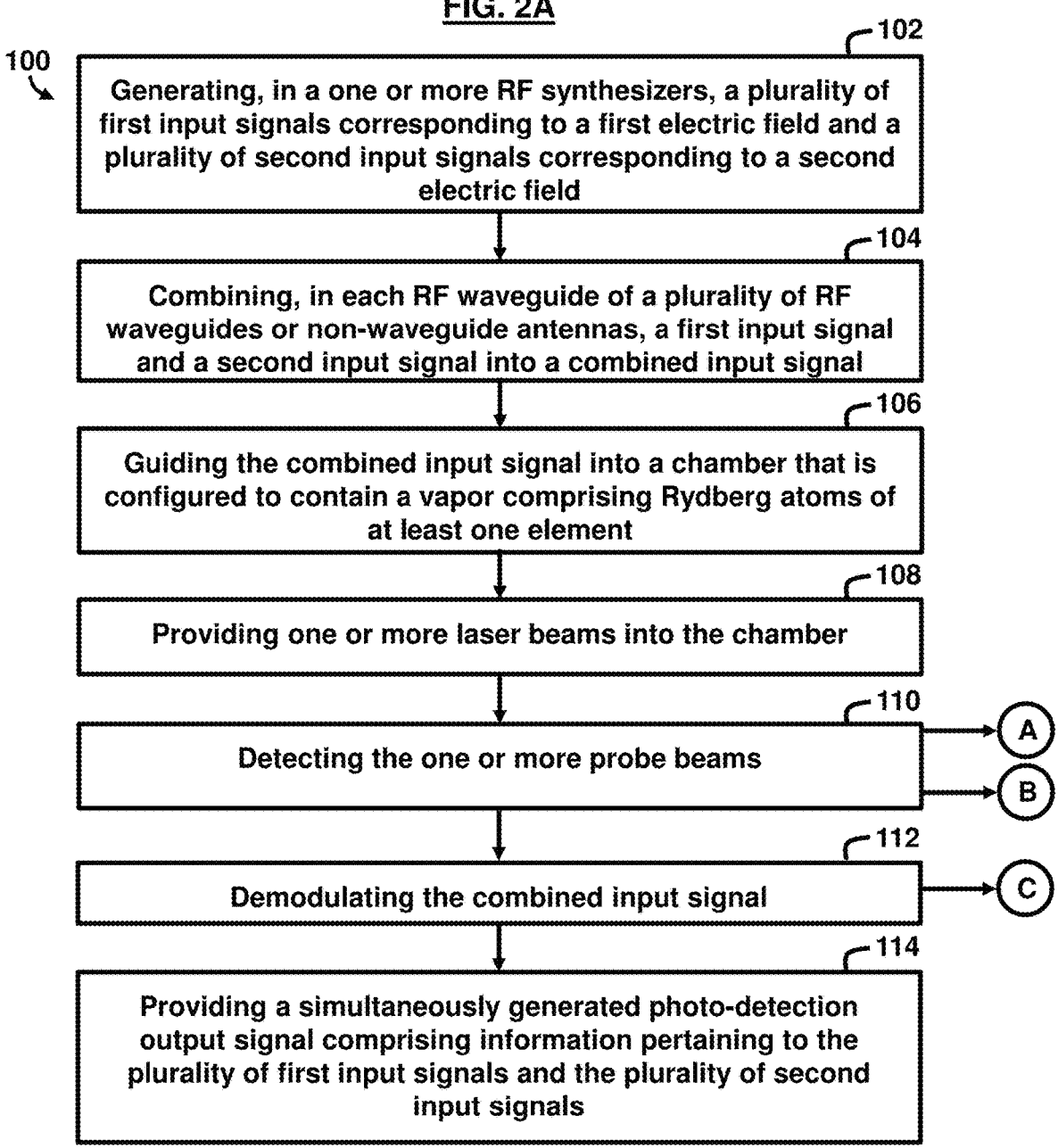

100

102
Generating, in a one or more RF synthesizers, a plurality of first input signals corresponding to a first electric field and a plurality of second input signals corresponding to a second electric field 104
Combining, in each RF waveguide of a plurality of RF waveguides or non-waveguide antennas, a first input signal and a second input signal into a combined input signal 106
Guiding the combined input signal into a chamber that is configured to contain a vapor comprising Rydberg atoms of at least one element 108
Providing one or more laser beams into the chamber 110
Detecting the one or more probe beams     A     B 112
Demodulating the combined input signal     C 114
Providing a simultaneously generated photo-detection output signal comprising information pertaining to the plurality of first input signals and the plurality of second input signals

100

116

A

Using a photo-detector to detect the one or more probe beams

100

118

B

Performing balanced optical-homodyne detection of the one or more probe beams

100

120

C

Demodulating the multiple RF signals, wherein each RF signal is demodulated into a same optically-detected baseband signal

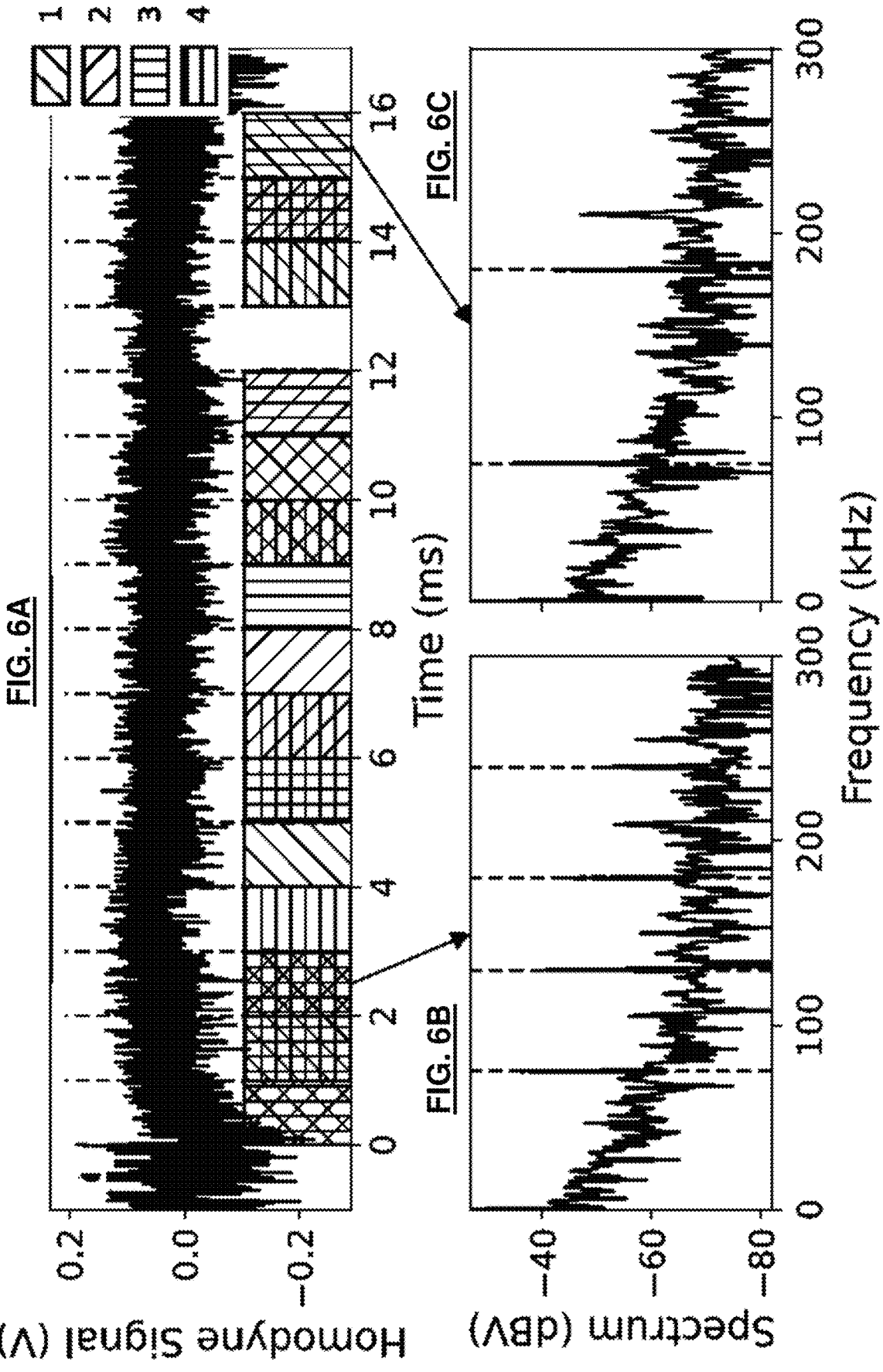

SIMULTANEOUS MULTI-BAND RYDBERG RECEIVER/SENSOR

GOVERNMENT INTEREST

The embodiments herein may be manufactured, used, and/or licensed by or for the United States Government without the payment of royalties thereon.

BACKGROUND

Technical Field

The embodiments herein generally relate to communication systems, and more particularly to electric field sensors based on Rydberg atoms.

Description of the Related Art

This background description includes information that may be useful in understanding the present invention. It is not an admission that any of the information provided herein is prior art or relevant to the presently claimed invention or that any publication specifically or implicitly referenced is prior art.

The radio frequency (RF) spectrum is typically defined as electromagnetic waves with frequencies between 30 kHz and 300 GHz, a range of six decades. Humans use this entire range for applications such as communication, remote sensing, navigation, and timekeeping. There is increasing interest in RF sensors based on Rydberg states of atoms, with a highly excited electron, because they exhibit sensitivity and resonances across the entire range.

In contrast, traditional RF sensors based on resonant antennas typically have limited bandwidth, operating over a fraction of a decade. The use of multiple RF bands usually requires more than one antenna, increasing the size and complexity of a system. Further, the use of multiple antennas often leads to colocation interference, where each antenna interferes with the performance of its neighbor. Rydberg atoms offer a unique path to overcome these technological challenges.

Recently, the field of Rydberg sensing has pointed to the capability of Rydberg atoms to detect RF fields across the entire spectrum, using various methods including multiple atomic species, Stark tuning of resonances, utilization of the off-resonant Stark effect, multiphoton resonances, and operation across the vast forest of Rydberg resonances, with demonstrations ranging from the terahertz to the quasi-dc regimes.

SUMMARY

In view of the foregoing, an embodiment herein provides an apparatus for simultaneous demodulation of radio frequency (RF) signals, the apparatus comprising a chamber configured to contain a vapor comprising Rydberg atoms of at least one element; a one or more RF synthesizers configured to generate a plurality of first input signals corresponding to a first electric field and a plurality of second input signals corresponding to a second electric field; a plurality of RF waveguides or non-waveguide antennas coupled to the one or more RF synthesizers, wherein each RF synthesizer of the one or more RF synthesizers is coupled to a RF waveguide such that each RF waveguide is to guide its corresponding input signal at a frequency band that is distinct from frequency bands of the other RF waveguides of the plurality of RF waveguides or non-waveguide antennas; one or more lasers configured to provide one or more laser beams into the chamber, wherein the one or more laser beams are configured to provide atomic excitation of at least some of the Rydberg atoms of the at least one element in the vapor within the chamber to one or more Rydberg states, the one or more laser beams being further configured to provide one or more probe beams passing through the chamber to modulate the input signal; and one or more devices configured to detect the one or more probe beams, demodulate the input signal, and provide a simultaneously generated photo-detection output signal comprising information pertaining to the plurality of first input signals and the plurality of second input signals.

The at least one element may comprise any of an alkali and alkaline earth metal vapor. The plurality of first input signals may comprise local oscillator (LO) signals and the plurality of second input signals may comprise electric field signals. The one or more devices may comprise a photo-detector. The one or more devices may comprise a balanced optical-homodyne detector. The plurality of first input signals may comprise multiple RF signals having distinct frequencies from each other. The one or more devices may be configured to demodulate the multiple RF signals, and each RF signal may be demodulated into a same optically-detected baseband signal. The one or more laser beams may comprise a coupling laser beam. Each signal beat (e.g., a heterodyne beat) of the plurality of first input signals is to add linearly to other signal beats of the plurality of first input signals. The Rydberg atoms are to provide a demodulation of each signal beat into a same signal baseband.

Another embodiment provides a method for performing simultaneous demodulation of RF signals, the method comprising generating, in a one or more RF synthesizers, a plurality of first input signals corresponding to a first electric field and a plurality of second input signals corresponding to a second electric field; guiding the input signal into a chamber that is configured to contain a vapor comprising Rydberg atoms of at least one element, wherein each RF synthesizer of the one or more RF synthesizers is coupled to a RF waveguide such that each RF waveguide is to guide its corresponding input signal at a frequency band that is distinct from frequency bands of the other RF waveguides of the plurality of RF waveguides or non-waveguide antennas; providing one or more laser beams into the chamber, wherein the one or more laser beams are configured to provide atomic excitation of at least some of the Rydberg atoms of the at least one element in the vapor within the chamber to one or more Rydberg states, the one or more laser beams being further configured to provide one or more probe beams passing through the chamber to modulate the input signal; detecting the one or more probe beams; demodulating the input signal; and providing a simultaneously generated photo-detection output signal comprising information pertaining to the plurality of first input signals and the plurality of second input signals.

The at least one element may comprise any of an alkali and alkaline earth metal vapor. The plurality of first input signals may comprise LO signals and the plurality of second input signals may comprise electric field signals. The method may comprise using a photo-detector to detect the one or more probe beams. The method may comprise performing balanced optical-homodyne detection of the one or more probe beams. The plurality of first input signals may comprise multiple RF signals having distinct frequencies from each other. The method may comprise demodulating the multiple RF signals, wherein each RF signal may be demodulated into a same optically-detected baseband signal. The one or more laser beams may comprise a coupling laser beam. Each signal beat of the plurality of first input signals is to add linearly to other signal beats of the plurality of first input signals. The Rydberg atoms are to provide a demodulation of each signal beat into a same signal baseband.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 2A is a flow diagram illustrating a method for performing simultaneous demodulation of RF signals, according to an embodiment herein;

FIG. 6A is a graph illustrating an example symbol recovery of a communications signal with the raw time trace of the EIT output from the photodetector, taken with a sample rate of 4 MS/s, according to an embodiment herein;

FIG. 6B is a graph illustrating the FFT of the third symbol in the sequence of FIG. 6A, according to an embodiment herein;

FIG. 6C is a graph illustrating the FFT of the 15$^{th}$ symbol in the sequence of FIG. 6A, according to an embodiment herein;

Figure 1:
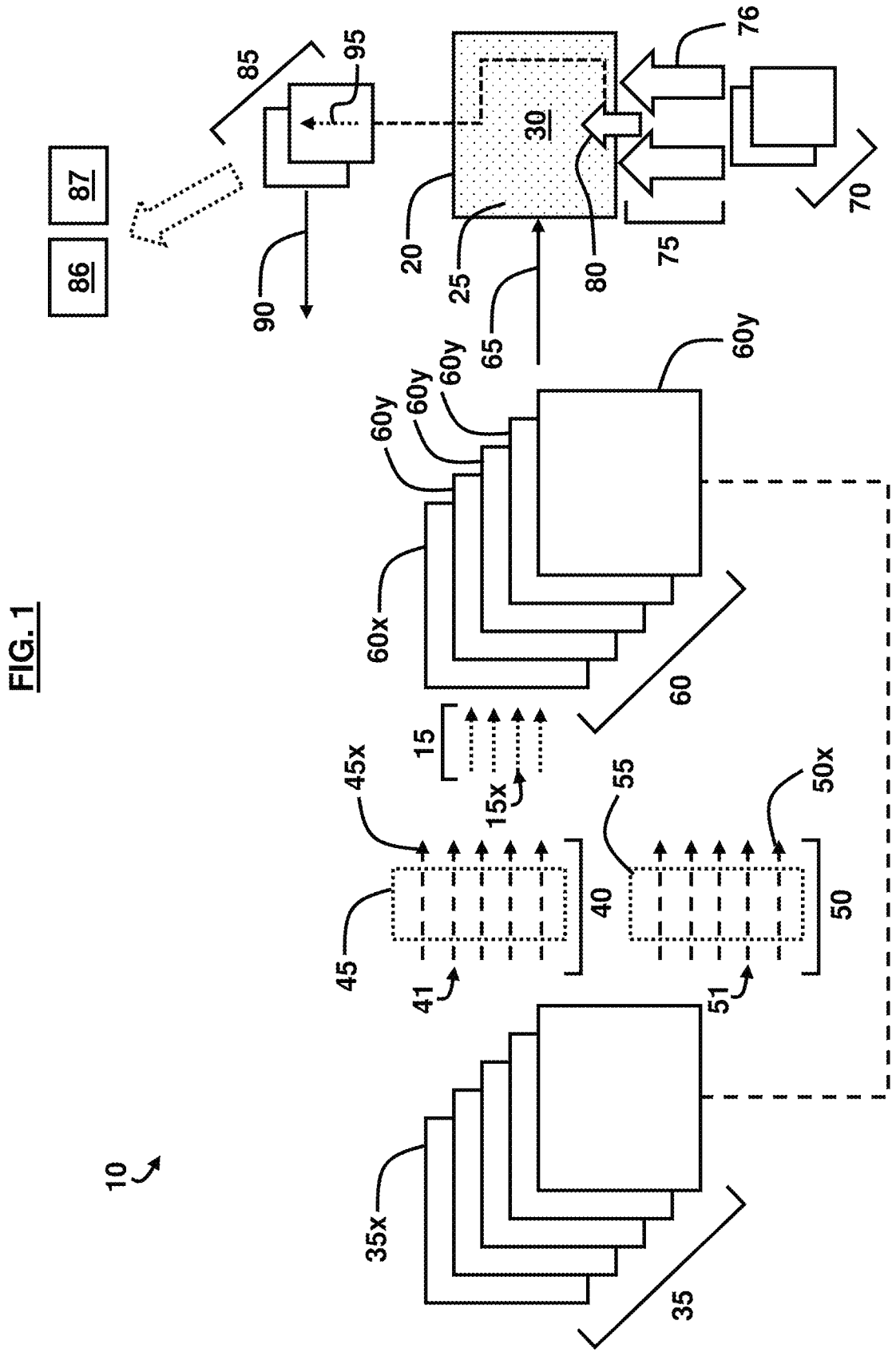
FIG. 1 is a block diagram illustrating an apparatus, according to an embodiment herein.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein. The following description of particular embodiment(s) is merely exemplary in nature and is in no way intended to limit the scope of the invention, its application, or uses, which can, of course, vary.

It will be understood that when an element or layer is referred to as being "on", "connected to", or "coupled to" another element or layer, it may be directly on, directly connected to, or directly coupled to the other element or layer, or intervening elements or layers may be present. In contrast, when an element or layer is referred to as being "directly on", "directly connected to", or "directly coupled to" another element or layer, there are no intervening elements or layers present. It will be understood that for the purposes of this disclosure, "at least one of X, Y, and Z" or "any of X, Y, and Z" may be construed as X only, Y only, Z only, or any combination of two or more items X, Y, and Z (e.g., XYZ, XY, XZ, YZ).

The description herein describes inventive examples to enable those skilled in the art to practice the embodiments herein and illustrates the best mode of practicing the embodiments herein. Upon reading the following description in light of the accompanying drawing figures, those skilled in the art will understand the concepts of the disclosure and will recognize applications of these concepts not particularly addressed herein.

The terms first, second, etc. may be used herein to describe various elements, but these elements should not be limited by these terms as such terms are only used to distinguish one element from another. For example, a first element could be termed a second element, and, similarly, a second element could be termed a first element, etc. without departing from the scope of the present disclosure. As used herein, the term "and/or" includes any and all combinations of one or more of the associated listed items.

Furthermore, although the terms "final", "first", "second", "upper", "lower", "bottom", "side", "intermediate", "middle", and "top", etc. may be used herein to describe various elements, but these elements should not be limited by these terms. These terms are only used to distinguish one element from another. For example, a first element could be termed an "top" element and, similarly, a second element could be termed a "top" element depending on the relative orientations of these elements.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. "Or" means "and/or." As used herein, the term "and/or" includes any and all combinations of one or more of the associated listed items. It will be further understood that the terms "comprises" and/or "comprising," or "includes" and/or "including" when used herein, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

Unless otherwise defined, all terms (including technical and scientific terms) used herein have the same meaning as commonly understood by one of ordinary skill in the art to which this disclosure belongs. It will be further understood that terms such as those defined in commonly used dictionaries, should be interpreted as having a meaning that is consistent with their meaning in the context of the relevant art and the present disclosure, and will not be interpreted in an idealized or overly formal sense unless expressly so defined herein.

The embodiments herein provide for simultaneous multiband demodulation using multiple Rydberg states. The square-law sensitivity of Rydberg atoms in the off-resonant regime allows simultaneous demodulation. Moreover, an apparatus is provided to demonstrate the demodulation and detection of five tones, ranging from 1.7 GHz to 116 GHz. The amplitude and phase of each tone can be recovered simultaneously by demodulating into different portions of the baseband, with approximately 6 MHz of instantaneous bandwidth. Additionally, simultaneous detection of binary digital signals with four tones at bit rates of up to 40 kbit/s with bit-error rates better than 0.6 kbit/s are achieved in accordance with the embodiments herein. The multi-band Rydberg sensor provided by the embodiments herein uses Rydberg atoms in conjunction with multiple RF local oscillator fields to allow for simultaneous demodulation of signal RF fields spanning the entire operational range of the Rydberg sensor, from 0 Hertz to nearly 1 terahertz. The broadband nature of the Rydberg sensor is used to combine multiple simultaneously demodulated signals into the same output baseband, which is measured optically. Referring now to the drawings, and more particularly to FIGS. 1 through 8, where similar reference characters denote corresponding features consistently throughout the figures, there are shown preferred embodiments. In the drawings, the size and relative sizes of components, layers, and regions, etc. may be exaggerated for clarity.

FIG. 1 is a block diagram illustrating an apparatus 10 for simultaneous demodulation of radio frequency (RF) signals 15. The apparatus 10 comprises a chamber 20 configured to contain a vapor 25 comprising Rydberg atoms 30 of at least one element; a one or more RF synthesizers 35 configured to generate a plurality of first input signals 40 corresponding to a first electric field 45 and a plurality of second input signals 50 corresponding to a second electric field 55; a plurality of RF waveguides or non-waveguide antennas 60 coupled to the one or more RF synthesizers 35, wherein each RF waveguide 60x of the plurality of RF waveguides or non-waveguide antennas 60 is to combine a first input signal 45x and a second input signal 50x received from its corresponding RF synthesizer 35x as a combined input signal 65 and guide the combined input signal 65 into the chamber 20, and wherein each RF synthesizer 35x of the one or more RF synthesizers 35 is coupled to a RF waveguide 60x such that each RF waveguide 60x is to guide its corresponding combined input signal 65 at a frequency band that is distinct from frequency bands of the other RF waveguides 60y of the plurality of RF waveguides or non-waveguide antennas 60; one or more lasers 70 configured to provide one or more laser beams 75 into the chamber 20, wherein the one or more laser beams 75 are configured to provide atomic excitation of at least some of the Rydberg atoms 30 of the at least one element in the vapor 25 within the chamber 20 to one or more Rydberg states, the one or more laser beams 75 being further configured to provide one or more probe beams 80 passing through the chamber 20 to modulate the combined input signal 65; and one or more devices 85 configured to detect the one or more probe beams 80, demodulate the combined input signal 65, and provide a simultaneously generated photo-detection output signal 90 comprising information pertaining to the plurality of first input signals 40 and the plurality of second input signals 50. The embodiments herein may have a single source produce multiple tones. For example, a single field with multiple widely separated subcomponents may be utilized. In accordance with the embodiments herein, multitone is more multi-band (i.e., the tones are separated in frequency by a large amount, typically much larger than the receiver instantaneous bandwidth), wherein multiple tones are spread over many bands. In an example, the one or more RF synthesizers 35 is coupled to its own RF waveguide 60x.

The at least one element may comprise any Rydberg or highly excited atom-like state with large polarizability or dipole moment. For example, the at least one element may comprise any of an alkali and alkaline earth metal vapor. In another example, the at least one element may comprise any of rubidium and cesium. The plurality of first input signals 40 may comprise local oscillator (LO) signals 41 and the plurality of second input signals 50 may comprise electric field signals 51. The one or more devices 85 may comprise a photo-detector 86. The one or more devices 85 may comprise a balanced optical-homodyne detector 87. The plurality of first input signals 40 may comprise multiple RF signals 15 having distinct frequencies from each other. The one or more devices 85 may be configured to demodulate the multiple RF signals 15, and each RF signal 15x may be demodulated into a same optically-detected baseband signal 95. The one or more laser beams 75 may comprise a coupling laser beam 76. Each signal beat (e.g., a heterodyne beat) of the plurality of first input signals 40 is to add linearly to other signal beats of the plurality of first input signals 40. More specifically, the atomic beat frequencies combine linearly, according to an example. The Rydberg atoms 30 are to provide a demodulation of each signal beat into the same signal baseband.

Figures 2B, 2C, 2D:
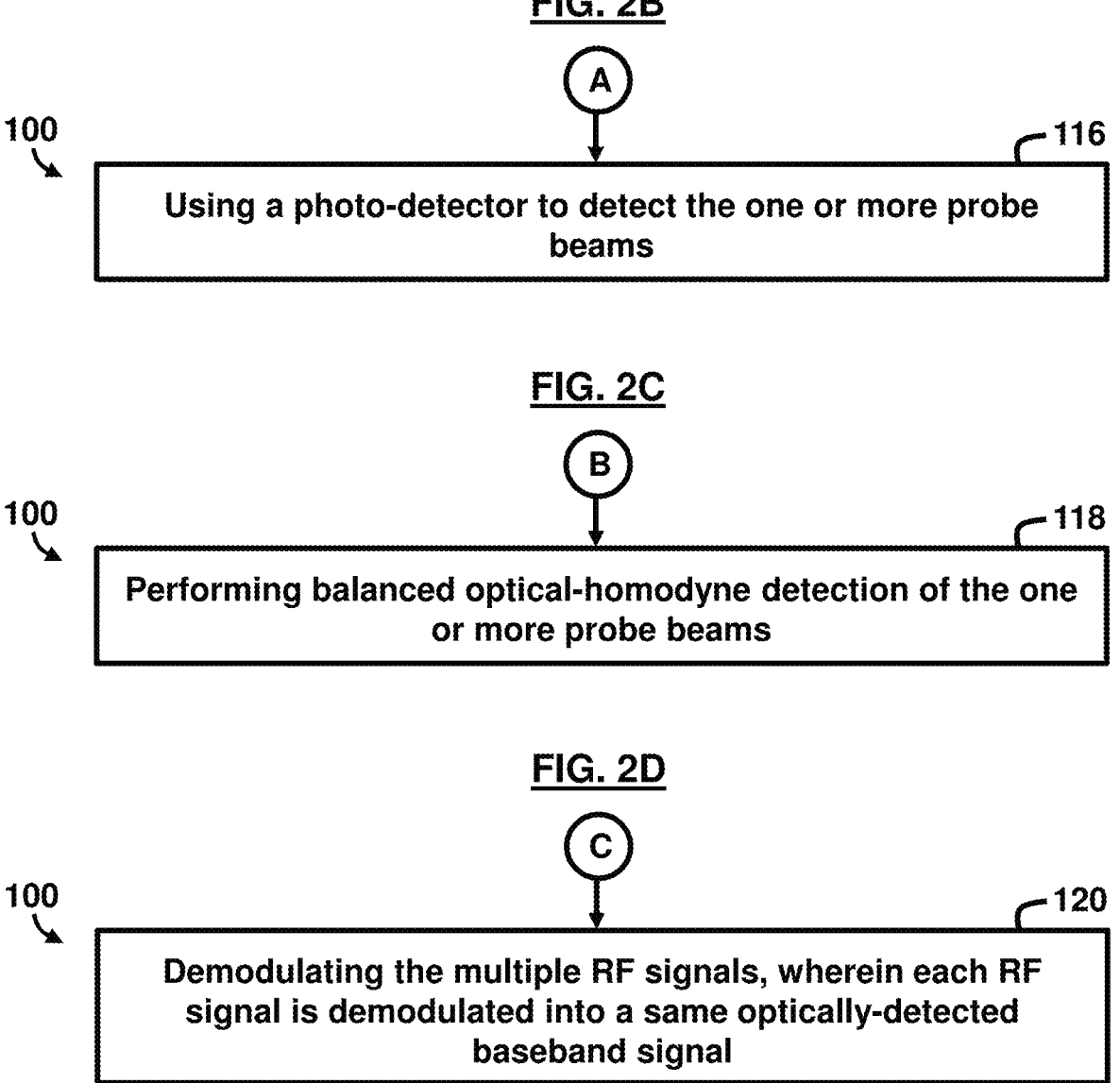
FIG. 2B is a flow diagram illustrating a method of detecting probe beams, according to an embodiment herein.
FIG. 2C is a flow diagram illustrating another method of detecting probe beams, according to an embodiment herein.
FIG. 2D is a flow diagram illustrating a method of demodulation, according to an embodiment herein.

FIGS. 2A through 2D, with reference to FIG. 1, are flow diagrams illustrating a method 100 for performing simultaneous demodulation of RF signals 15. As indicated in FIG. 2A, the method 100 comprises generating (102), in a one or more RF synthesizers 35, a plurality of first input signals 40 corresponding to a first electric field 45 and a plurality of second input signals 50 corresponding to a second electric field 55; combining (104), in each RF waveguide 60*x* of a plurality of RF waveguides or non-waveguide antennas 60, a first input signal 45*x* and a second input signal 50*x* into a combined input signal 65; guiding (106) the combined input signal 65 into a chamber 20 that is configured to contain a vapor 25 comprising Rydberg atoms 30 of at least one element, wherein each RF synthesizer 35*x* of the one or more RF synthesizers 35 is coupled to a RF waveguide 60*x* such that each RF waveguide 60*x* is to guide its corresponding combined input signal 65 at a frequency band that is distinct from frequency bands of the other RF waveguides 60*y* of the plurality of RF waveguides or non-waveguide antennas 60; providing (108) one or more laser beams 75 into the chamber 20, wherein the one or more laser beams 75 are configured to provide atomic excitation of at least some of the Rydberg atoms 30 of the at least one element in the vapor 25 within the chamber 20 to one or more Rydberg states, the one or more laser beams 75 being further configured to provide one or more probe beams 80 passing through the chamber 20 to modulate the combined input signal 65; detecting (110) the one or more probe beams 80; demodulating (112) the combined input signal 65; and providing (114) a simultaneously generated photo-detection output signal 90 comprising information pertaining to the plurality of first input signals 40 and the plurality of second input signals 50. In an example, the one or more RF synthesizers 35 is coupled to its own RF waveguide 60*x*.

The at least one element may comprise any Rydberg or highly excited atom-like state with large polarizability or dipole moment. For example, the at least one element may comprise any of an alkali and alkaline earth metal vapor. In another example, the at least one element may comprise any of rubidium and cesium. The plurality of first input signals 40 may comprise LO signals 41 and the plurality of second input signals 50 may comprise electric field signals 51. As indicated in FIG. 2B, the method 100 may comprise using (116) a photo-detector 86 to detect the one or more probe beams 80. As indicated in FIG. 2C, the method 100 may comprise performing (118) balanced optical-homodyne detection of the one or more probe beams 80. The plurality of first input signals 40 may comprise multiple RF signals 15 having distinct frequencies from each other. As indicated in FIG. 2D, the method 100 may comprise demodulating (120) the multiple RF signals 15, wherein each RF signal 15*x* may be demodulated into a same optically-detected baseband signal 95. The one or more laser beams 75 may comprise a coupling laser beam 76. Each signal beat of the plurality of first input signals 40 is to add linearly to other signal beats of the plurality of first input signals 40. More specifically, the atomic beat frequencies combine linearly, according to an example. The Rydberg atoms 30 are to provide a demodulation of each signal beat into the same signal baseband.

Figure 3A:
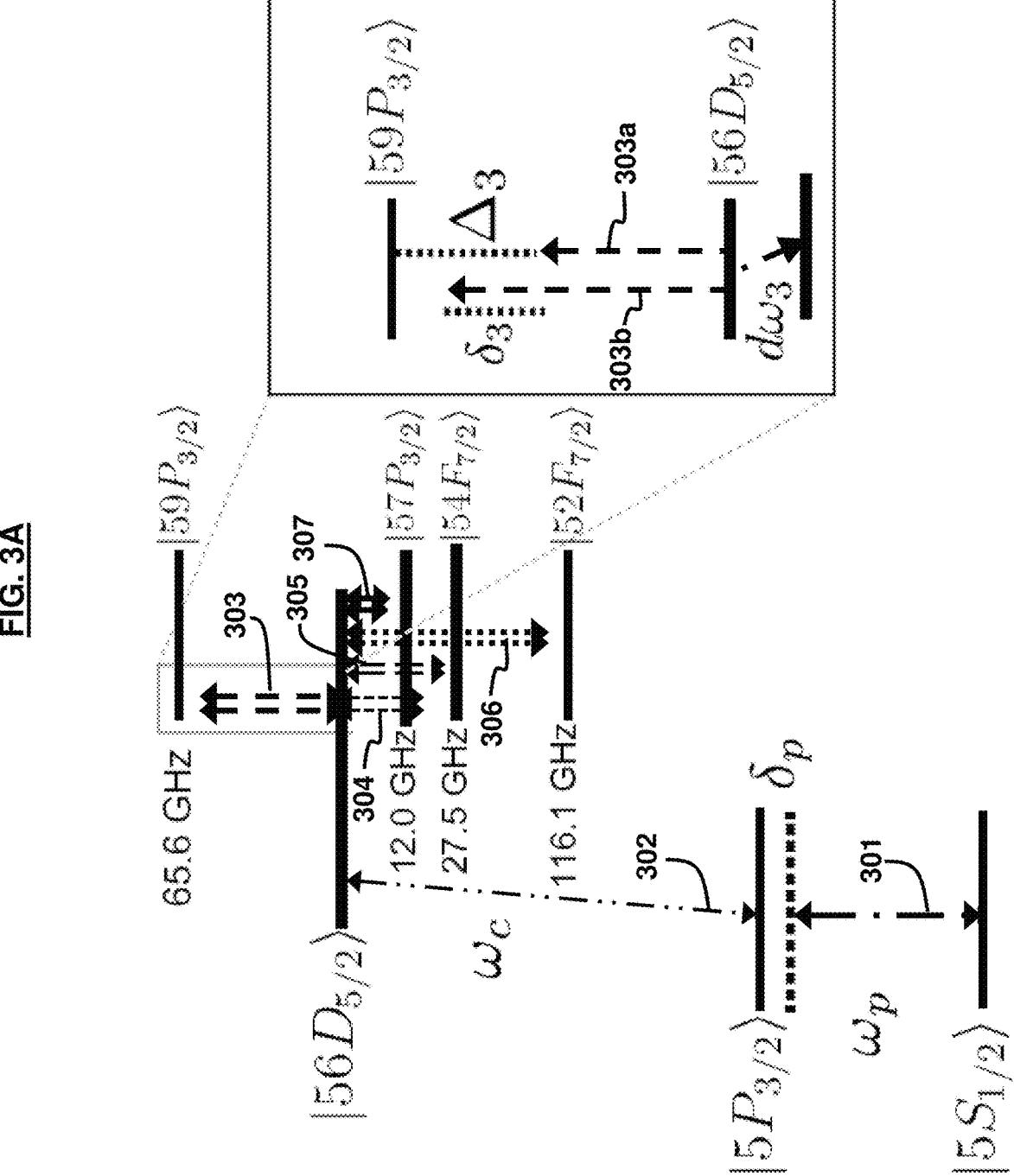
FIG. 3A is an atomic energy-level diagram, according to an embodiment herein.

The level diagram of the Rydberg sensor is shown in FIG. 3A, with reference to FIGS. 1 through 2D. The sensor is operated by performing spectroscopy on a single Rydberg "target" state. Interaction with multiple RF tones (denoted by the various arrows) leads to simultaneous perturbations in the state energy. These perturbations are measured spectroscopically via a ladder-electromagnetically induced transparency (EIT) scheme comprised of a probe and a coupling laser. However, different EIT configurations may also be utilized (e.g. V, Lambda, etc.) and/or spectroscopy may be performed on multiple Rydberg states (e.g. dressing fields), according to other examples.

In order to simultaneously detect the perturbations on the target state from multiple RF signals, the signal perturbations combine linearly in the spectroscopic response, allowing for a linear recovery of each signal tone. This condition can be stated as:

$$d\omega = \sum_i d\omega_i, \qquad (1)$$

where $d\omega$ is the total frequency shift of the target Rydberg state and $d\omega_i$ is the frequency shift due to a single RF field $E_i$. If this condition is not satisfied, the spectroscopic response to multiple RF fields is nonlinear, where simultaneous signal recovery generally becomes complex and interdependent. In accordance with the embodiments herein, RF couplings are utilized to the target state that satisfy Eq. (1).

The apparatus 10 simultaneously detects five signals, with frequencies 1.72, 12.11, 27.42, 65.11, and 115.75 GHz. The highest four of these signals operate somewhat detuned from nearby Rydberg transitions, while the lowest frequency of 1.72 GHz, is far red-detuned from all relevant transitions. In this off-resonant regime, the Rydberg energy shifts scale quadratically with the field amplitude:

$$d\omega_i = \langle a_i(E_i)^2 \rangle, \qquad (2)$$

where $a_i$ is the polarizability and the angle brackets denote a time average representing the finite instantaneous response bandwidth of the atomic sensor. Working in this detuned regime, in contrast to multiple resonant RF couplings, allows for linear addition of the $d\omega_i$ shifts (as explained further below in Appendix A).

In each band, two fields are applied to implement an RF heterodyne measurement, one signal electric field $S_i$ and one local oscillator (LO) $E_i \gg S_i$, using resonant RF couplings. When the signal and LO fields are far detuned from resonance, the resulting state shift is:

$$d\omega_i = a_i\left[\frac{E_i^2}{2} + \frac{S_i^2}{2} + E_i S_i \cos(\delta_i t)\right]. \qquad (3)$$

The first two terms represent static shifts due to the rms amplitudes of the LO and signal fields. The final term in Eq. (3) represents the signal field demodulated into the sensor baseband, with base-band frequency $\delta_i$. Due to the square-law response to the applied field when working off resonance, this term also has heterodyne gain from the amplitude of the LO field itself. EIT spectroscopy is used to detect the shifted resonance frequency of the target state $d\omega$, which contains information from all of the applied fields $E_i + S_i$ according to Eqs. (1) and (3).

The atomic energy-level diagrams of the full system are shown in FIG. 3A. Using two lasers (denoted as "probe" (301) and "coupling" (302)), EIT spectroscopy is performed on the $|56\,D_{5/2}\rangle$ target state to simultaneously detect five RF signal tones 303, 304, 305, 306, 307. The Rydberg demodulation scheme for a single tone is shown in the inset of FIG. 3A. For each tone i, a strong LO field $E_i$ is applied from a microwave horn, with detuning from the target state $\Delta_i$. The corresponding signal field $S_i$ has a small detuning $\delta_i$ from the LO and is broadcast from the same corresponding horn to superimpose it with $E_i$ at the atomic sample. By Eq. (3), this leads to a detected base-band signal (e.g., a heterodyne beat) with frequency $\delta_i$.

Optical spectroscopy is performed in a ladder-EIT configuration (denoted by arrows 301, 302). The microwave couplings are shown as arrows 303-307 branching from the 56 $D_{5/2}$ state. The resonant frequencies of the transitions to nearby Rydberg states are shown. The inset shows the energy-level diagram for off-resonant heterodyne measurements using Rydberg states. A strong LO field, detuned from atomic resonance, produces a large Stark shift $d\omega_i$ of the target Rydberg state. A weak signal tone, detuned from the LO field, produces beats in the Stark shift of the target state that can be measured spectroscopically.

Figure 3B:
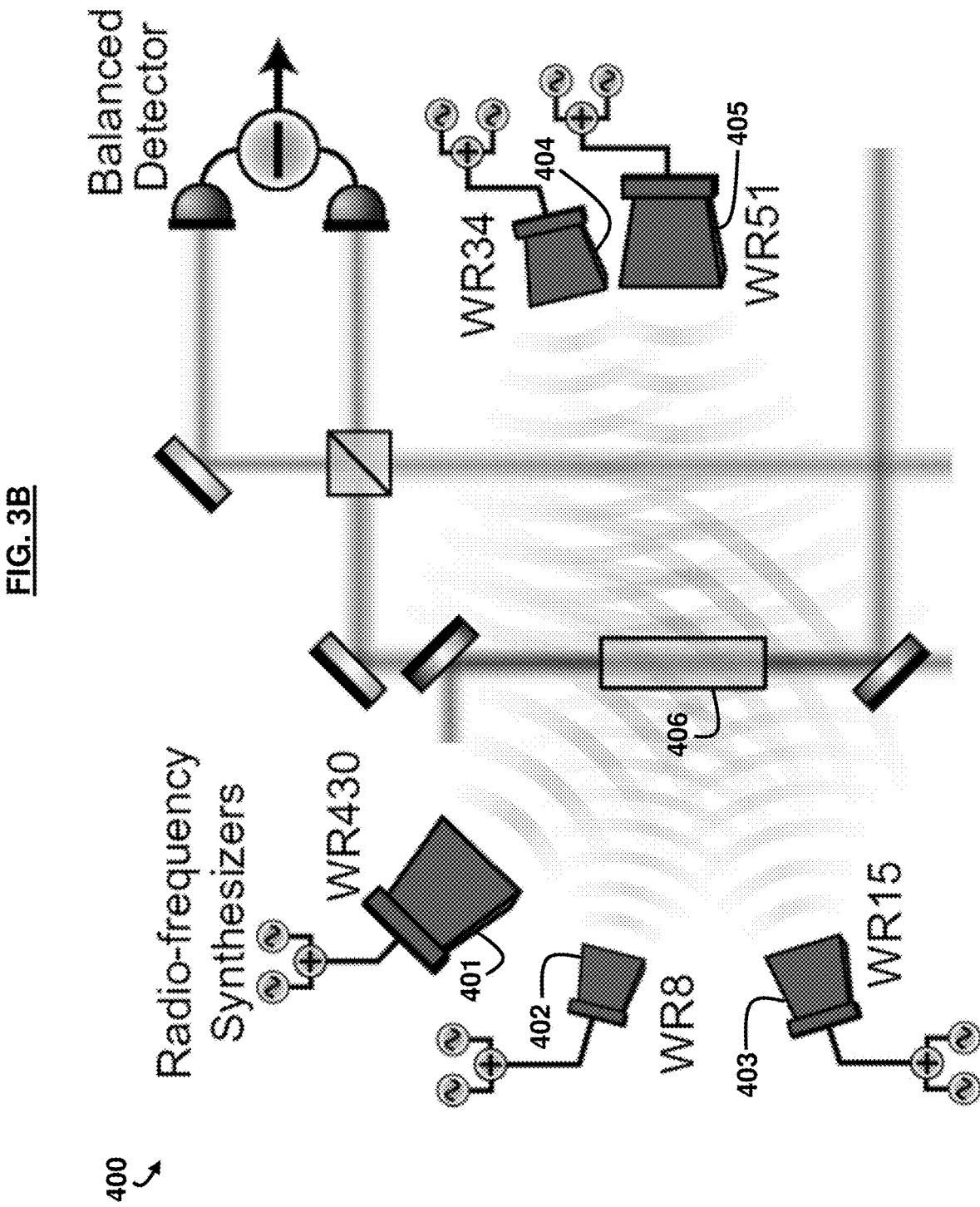
FIG. 3B is a block diagram illustrating an experimental apparatus, according to an embodiment herein.

FIG. 3B depicts an experimental apparatus 400. The embodiments herein are not restricted to the particular materials, brands, parameters, or configurations described below as the descriptions are merely a non-limiting experimental example. Five separate RF horns 401-405 are aimed at the Rb vapor cell 406 from approximately 30 cm away. The horns 401-405 corresponding to tones 1-5 are fed by waveguides of size WR51, WR34, WR15, WR8, and WR430, respectively. The cell 406 is 7.5 cm long and contains natural-abundance Rb. A narrow transmission resonance (EIT) is observed when the probe laser detuning $\delta_p$ is swept across the $|5 S_{1/2}\rangle \rightarrow |56 D_{5/2}\rangle$ two-photon resonance. These spectroscopy signals are detected using a balanced optical-homodyne configuration operated in the phase quadrature, yielding a dispersive-shaped EIT feature as the probe laser detuning is swept. To avoid ambiguity with the RF signals, the output homodyne signal is referred to herein as the "output". For all data shown, except FIG. 3D, the probe is locked to the center of the EIT dispersive feature, where the slope (and therefore the sensitivity) is largest.

The frequencies of the five RF tones, their index labels, and their respective field amplitudes at the atomic sample are shown in Table I.

TABLE I

The RF tone experimental parameters, including the tone number, the nearby Rydberg state being coupled to, the resonance frequency of that coupling $\omega_0^i$, the detuning of the LO field relative to that resonance $\Delta_i$, the typical signal detuning from the LO field $\delta_i$ unless otherwise noted, and the signal and LO-field amplitudes at the atomic sample $E_i$ and $S_i$, as described in Appendix C.

| Tone i | State $nL_J$ | $\omega_0^i$ (GHz) | $\Delta_i$ (GHz) | $\delta_i$ (kHz) | $E_i$ (V/m) | $S_i$ (V/m) |
|---|---|---|---|---|---|---|
| 1 | $57P_{3/2}$ | 12.01 | +0.1 | 75 | 1.2(1) | 0.12(1) |
| 2 | $54F_{7/2}$ | 27.52 | −0.1 | 130 | 2.4(2) | 0.14(1) |
| 3 | $59P_{3/2}$ | 65.61 | −0.5 | 180 | 17.9(26) | 1.5(3) |
| 4 | $52F_{7/2}$ | 116.05 | −0.3 | 240 | 36.0(36) | 1.4(2) |
| 5 | $57P_{3/2}$ | 12.01 | −10.287 | 280 | 16.0(4) | 2.3(1) |

Tones 1-4 are nearly resonant to a dipole-allowed Rydberg transition between the target state and the nearby state indicated in the table. Tone 5 is far red-detuned (>10 GHz) from all relevant Rydberg transitions. The inclusion of tone 5 in this demonstration highlights the broad operational range of the protocol relative to Rydberg transitions and that multiple tones can interact with the same Rydberg transition. The magnitudes of the signal fields are chosen such that the beat of each tone has approximately the same signal-to-noise ratio; differences in set point primarily reflect differences in the Rydberg sensitivity at that frequency via changes to the atomic polarizability $a_i$. This sensitivity and the linear dynamic range depend on the specific sensor configuration, including detuning from Rydberg resonances and RF LO powers and frequencies.

The LO and signal fields for tones 1, 2, and 5 are generated directly from commercial signal generators. The LO and signal fields for tones 3 and 4 are produced using synthesizers that are then multiplied by a factor of 6 before being broadcast onto the atoms. Further details of the experimental setup are given in Appendix B.

Figure 3C:
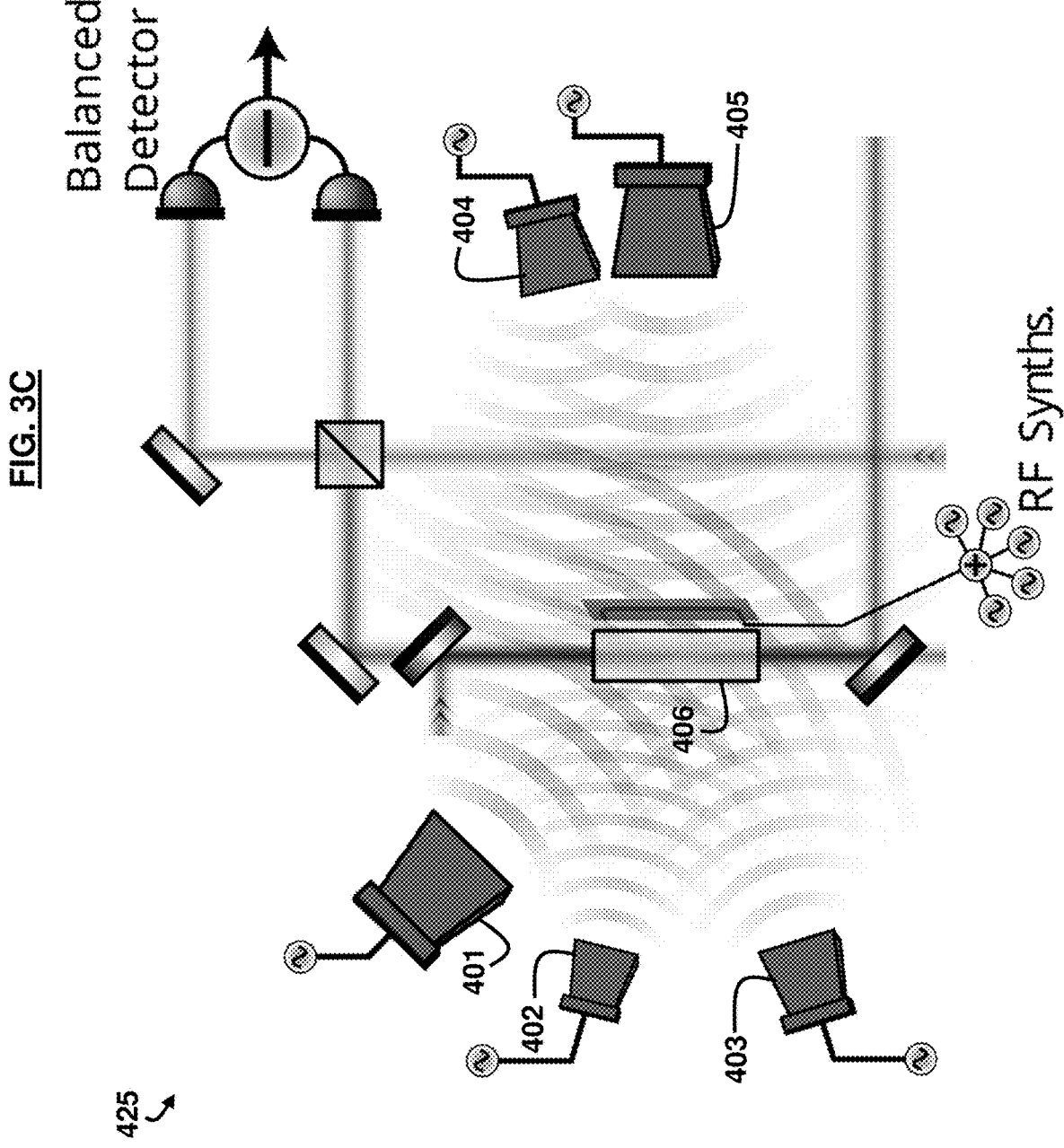
FIG. 3C is a block diagram illustrating another experimental apparatus, according to an embodiment herein.

FIG. 3C illustrates an alternative experimental apparatus 425 in which the first (e.g., stronger) fields may be applied locally to measure the second (e.g., weaker) fields that may or may not be applied locally (i.e., transmitted by someone else at a different location). In this regard, combining LO and signal fields for each tone inside a waveguide is not required; merely that all fields are applied to the atoms. For instance, all of the LOs could be applied via a wideband coplanar waveguide, and all of the signals could be free-space signals from different remote transmitters.

Figure 3D:
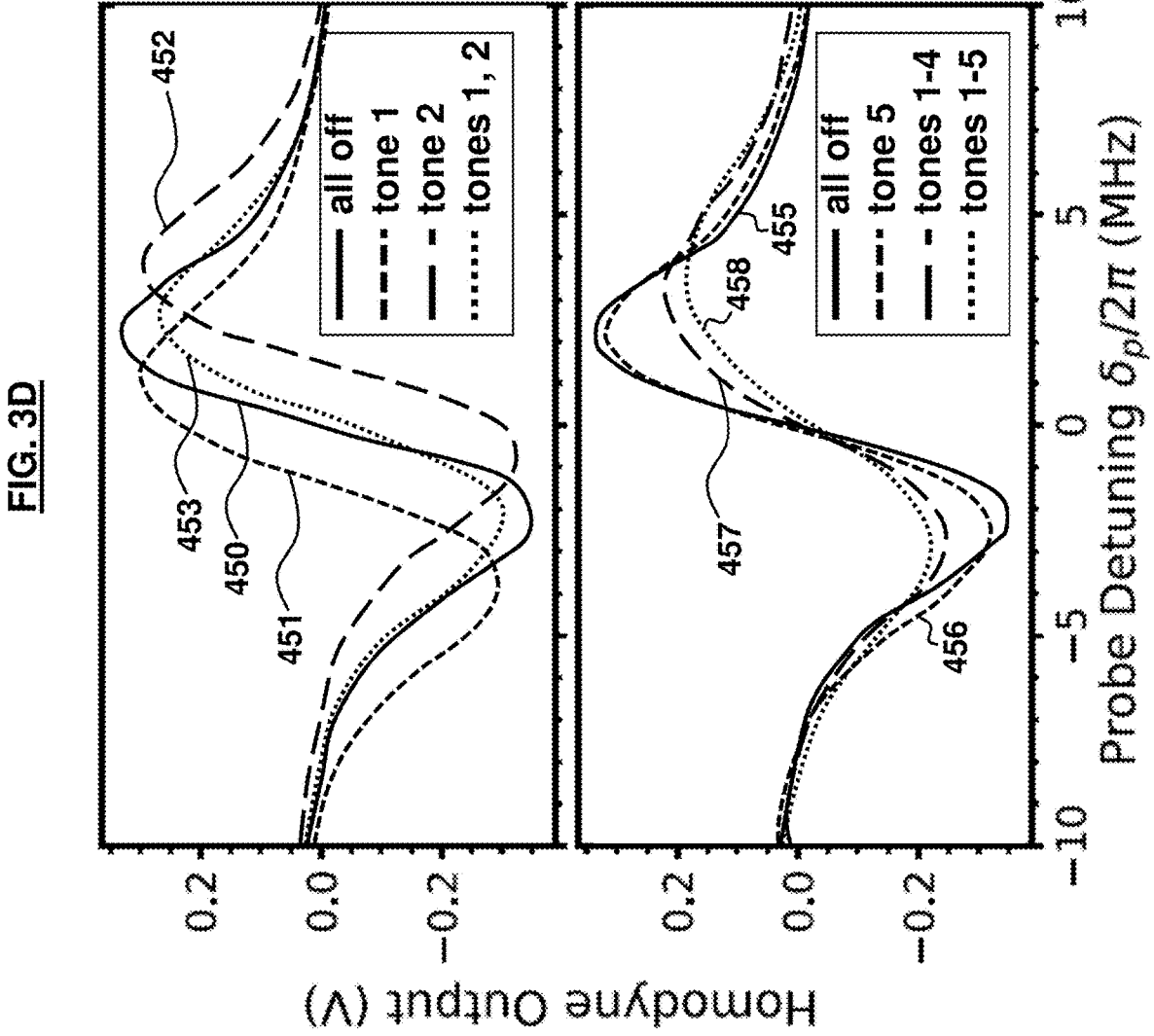
FIG. 3D are graphs illustrating example spectroscopy of the target Rydberg state and the effect of far-detuned couplings, according to an embodiment herein.

In FIG. 3D, the representative phase-quadrature optical EIT output is shown with various combinations of LO fields applied to the atoms. The top graph of FIG. 3D shows example probe-sweep-spectroscopy traces for LOs 1 and 2, which are relatively close detuned from Rydberg resonances. Trace 450 shows the unshifted dispersive resonance. Traces 451, 452 correspond to LO 1 or 2 being on, respectively, resulting in Stark shifts of the resonance in opposing directions. Trace 453 shows both LOs on, resulting in nominal canceling of the Stark shifts, though the resonance is broadened. This broadening is predominantly the result of populating multiple $m_J$ sublevels of the target state, where each sublevel results in a different dipole moment for the RF field. This specific source of broadening could be mitigated by only populating a single sublevel of the target state. Other potential sources of broadening, such as power broadening or inhomogeneous fields, would manifest similarly and should also be considered when optimizing the sensor performance.

In the bottom graph of FIG. 3D, the effect of far-detuned couplings is shown. Trace 455 shows the dispersive resonance with all LOs off. Trace 456 shows the observed Stark shift from LO 5. Due to the large detuning, there is no common shift in one direction, as the sublevels of the $D_{5/2}$ state do not all shift in the same direction (further details are described below in Appendix C). Trace 457 shows the dispersive resonance with LOs 1-4 on, resulting in a largely canceled shift but a broader feature. Trace 458 shows LOs 1-5 on, which leads to even more broadening of the dispersive feature. Since the sensitivity of the sensor is related to the slope of this dispersive feature (which converts Stark shifts to spectroscopic changes in the measured homodyne probe phase), broadening from increasing numbers of LO tones limits the number of signals that can be simultaneously measured with a given sensitivity.

Figure 4A:
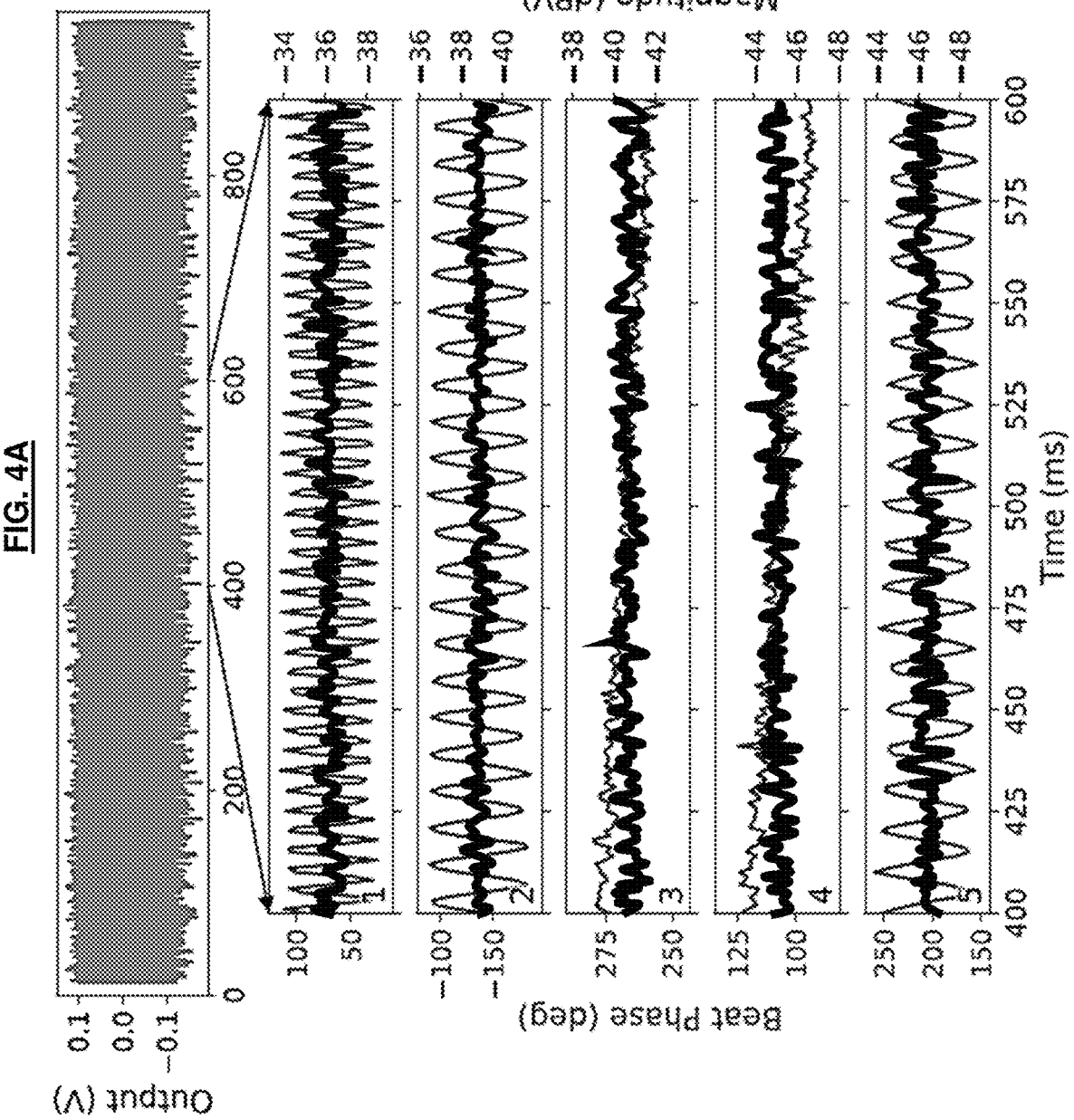
FIG. 4A are graphs illustrating the simultaneous amplitude and phase recovery of tones spanning over 114 GHz.
Figure 4B:
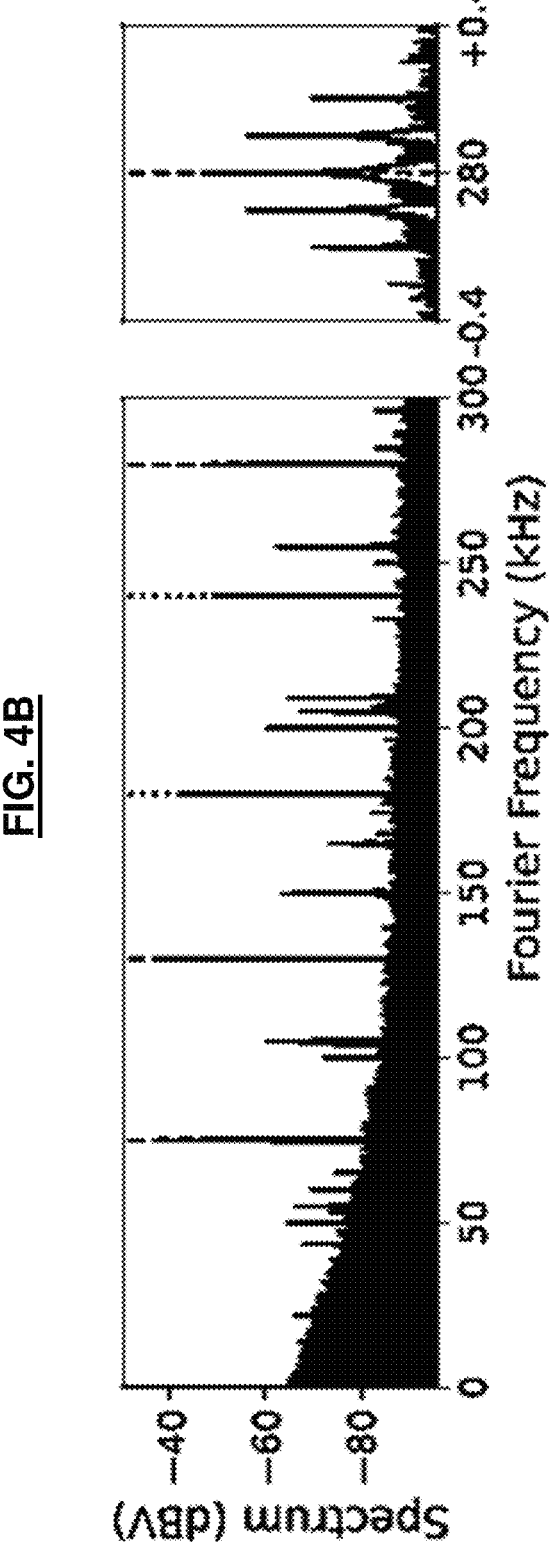
FIG. 4B is a graph illustrating the fast Fourier transform (FFT) of a full time trace and an enlarged view of the FFT around tone 5 at 280 kHz, according to an embodiment herein.

The data showing simultaneous demodulation of five tones into the baseband is described next. Tones 1-5 are broadcast onto the atoms and a time series of the homodyne output is recorded for 1 s. The raw output is displayed at the top of FIG. 4A and the processed data reveals the tones received from all five bands. The experimental settings are summarized in Table I. In these data, tones 1, 2, and 5 have 0.8-rad sinusoidal phase modulations applied with rates of 205 Hz, 110 Hz, and 100 Hz, respectively. FIGS. 4A and 4B illustrate the simultaneous amplitude and phase recovery of tones spanning over 114 GHz. In FIG. 4A, a single time trace of the photodetector output acquired at 2 MS/s over 1 s is acquired. The numbers 1-5 in FIG. 4A correspond to the amplitude (thin trace) and phase (thick trace) recovery for tones 1-5, respectively. Tones 1, 2, and 5 have slow phase modulations applied to the signal field of 205 Hz, 110 Hz, and 100 Hz, respectively.

All five tones are distinctly visible in the corresponding power spectrum shown in the left side graph of FIG. 4B, found by taking the fast Fourier transform (FFT) of the time trace in FIG. 4A. The FFT of the full time trace is 1 Hz. FIG. 4B presents an enlarged view of the FFT around tone 5 at 280 kHz, showing the clearly resolved phase-modulation sidebands. An enlarged subset of the power spectrum showing the detailed response in the vicinity of tone 5 is shown in the right side graph of FIG. 4B, where the phase-modulation sidebands are evident. The other beats in the spectrum are identified as harmonics and sum-or-difference frequencies of the five fundamental beats. The spurious tones are reduced by more than 20 dB from the fundamental tones and are indicative of a weakly nonlinear process, which can be attributed to residual nonlinearity in the optical-homodyne detection. Higher-order effects in the atomic system not considered may also be contributing. Three spurious tones can be independently identified due to electronic pick-up at 174, 180, and 209 kHz.

The phase and amplitude of each individual tone can be simultaneously recovered via suitable postprocessing of the time trace. The FFT can be taken of the raw data and each tone in frequency space can be extracted with a 1-kHz bandwidth. The amplitude and phase correspond to the magnitude and angle of the complex Fourier component. The phase and amplitude of each beat tone is displayed in FIG. 4A (1-5), shown as the thin and thick traces, respectively. The amplitudes of each tone are constant, with fluctuations in the recovered amplitude consistent with the Rydberg-sensor noise floor observed in FIG. 4B. This noise floor is largely white with 1/f probe laser phase noise dominating at frequencies below approximately 100 kHz because of unequal interferometer path lengths in the homodyne detection, which results in uncanceled laser phase noise. The overall phase offset of each beat corresponds to the uncontrolled phase offset of the LO and signal frequency sources between each tone. The phase modulations of tones 1, 2, and 5 manifest as sinusoidal variations of the recovered phase, matching the phase deviation (90° peak-to-peak) and modulation rates applied. The synthesizers for tones 3 and 4 are not modulated. The observed drifts in recovered phase instead correspond to the relative phase drift between the LO and signal channels for each synthesizer.

Figures 5A, 5B, 5C:
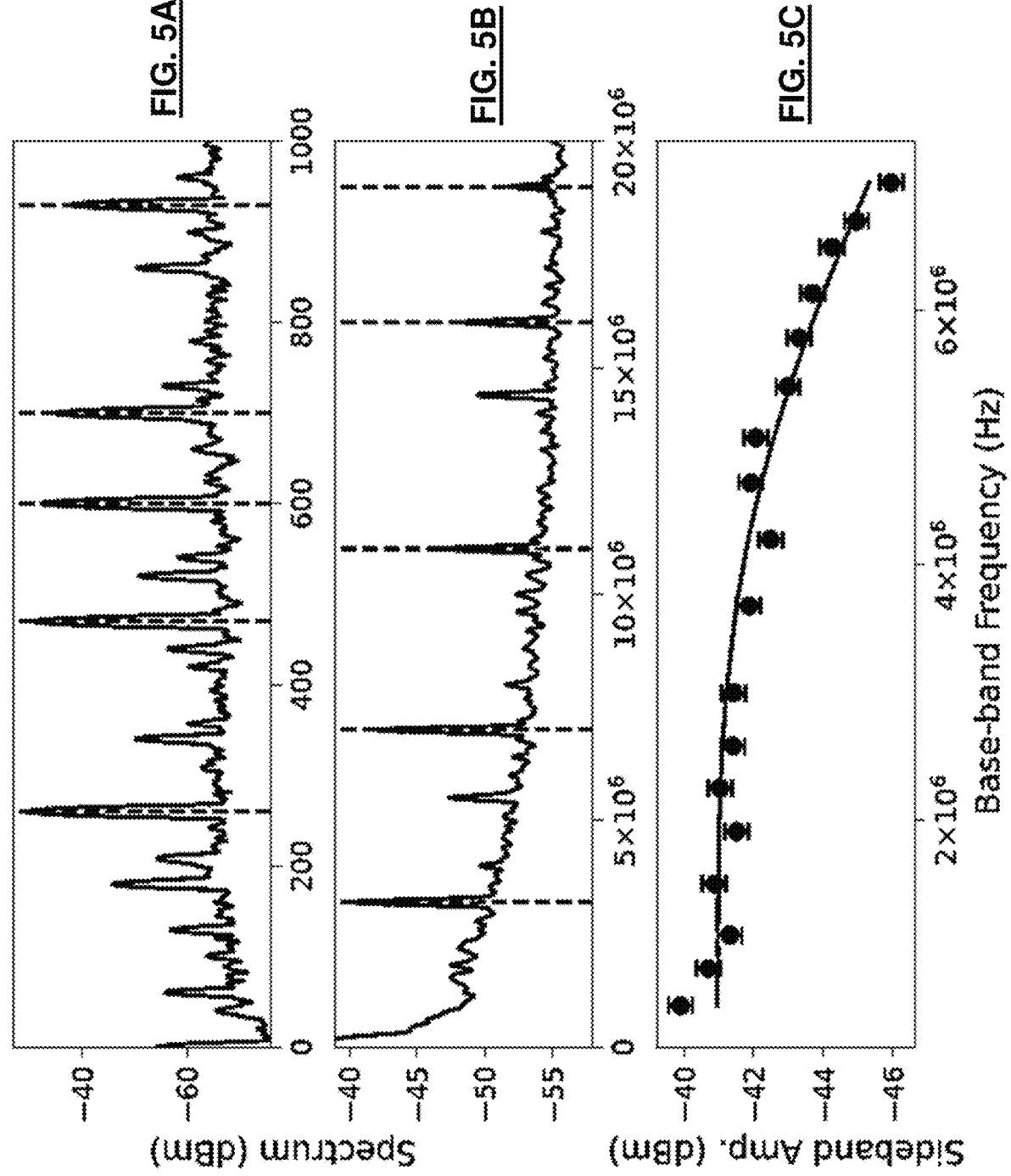
FIG. 5A is a graph of the spectrum-analyzer measurements of the EIT output with five RF heterodynes applied with beats at 260, 470, 600, 700, and 930 Hz for tones 1-5, according to an embodiment herein.
FIG. 5B is a graph of the spectrum-analyzer measurements of the EIT output with five RF heterodynes applied with beats at 16, 19, 11, 7, and 3.2 MHz for tones 1-5, respectively, according to an embodiment herein.
FIG. 5C is a graph of the output beat amplitude versus modulation frequency, according to an embodiment herein.

The total capacity for the Rydberg sensor to detect multiple tones is governed by the base-band instantaneous bandwidth, which is primarily set by an optical-spectroscopy method. This measured bandwidth of the spectrum-analyzer measurements of the EIT output with five RF heterodynes applied is shown in FIGS. 5A-5C. The vertical dashed lines denote the frequency of the applied beat tones. Each spectrum is an average of 20 traces. FIG. 5A depicts the beats at 260, 470, 600, 700, and 930 Hz for tones 1-5 and the resolution bandwidth is 4.89 Hz. The 1/f noise present in other spectra is suppressed in this frequency range due to active optical-homodyne path stabilization. FIG. 5B depicts the beats at 16, 19, 11, 7, and 3.2 MHz for tones 1-5, respectively. While the atomic response reduces beat sizes at higher frequencies, they are still visible. The photodetector frequency response is removed from this data set and the resolution bandwidth is 97.75 kHz. FIG. 5C depicts the output beat amplitude versus the modulation frequency. Phase modulation of 0.8 rad is applied to tone 2 (beat frequency at 130 kHz) at varying modulation frequencies.

The solid line in FIG. 5C is a fit to a second-order low-pass function with a 3-dB corner at 6.11 MHz. The photodetector response is removed from the data (see Appendix D below).

FIGS. 5A and 5B are representative five-tone power spectra with different baseband detunings $\delta_i$. In FIG. 5A, all $\delta_i < 2\pi \times 1$ kHz and in FIG. 5B, all $\delta_i$ are distributed over 20 MHz. The output reduction due to the instantaneous bandwidth roll-off is evident in FIG. 5B. In FIG. 5C, the bandwidth is directly measured by transmitting RF with a Fourier component of fixed amplitude and varying frequency. This can be accomplished by varying the frequency of a phase modulation on tone i=2. The measured data can be fit to a double-pole low-pass filter (shown as the solid line in FIG. 5C) that has a 3-dB point of 6.11 MHz. The number of individual beat tones that can be simultaneously measured depends on this bandwidth and the resolution bandwidth of the measurement. For example, using 10 kHz spacing between output beats as is done here, the 6.1 MHz bandwidth could nominally allow for 610 tones.

The application of many individual RF heterodyne pairs may be challenging due to the increased broadening of the Rydberg resonance with each LO and the potential for intermodulations between the beats, described above. It is possible to apply multiple signal beats to a single LO, helping to mitigate this limitation. In any case, the demonstration highlights the ability of the atoms to demodulate many highly disparate frequency tones (spanning 1.7-116 GHz) into a single baseband, detected optically.

Next, four-band communication reception is performed using an on-off-keying (OOK) protocol with tones 1-4 as described above, though far-off-resonant tones such as tone 5 could also be used. The OOK protocol does not encode information in the phase of the beats; however, the Rydberg sensor can observe the phase of each beat and the relative phase between beats. Protocols that encode information in these relative phases are interesting to consider but require transmitters to be phase synchronous. The four tones create 16 individual digital symbols, where an off tone represents a zero and an on tone represents a one. Each of these symbols are sent for a fixed period of time, by turning the signal sources on and off (the LOs stay on for the duration). An example is shown in FIGS. 6A-6C, where each symbol is sent for 1 ms. FIG. 6A is the raw time trace, with dashed vertical lines separating the time window of each symbol, and the hashed boxes denote which signal tones are on for each. In other words, the hashed boxes along the bottom axis denote which beat tones are on for each symbol period of 1 ms; tone 1 is the right diagonal, tone 2 is the left diagonal, tone 3 is the vertical, and tone 4 is the horizontal. The symbol that is present is recovered by taking a FFT in each window and comparing the amplitude at each beat frequency with a known fixed background level. FIGS. 6B and 6C show spectra for time windows 3 and 15. Window 3 has all tones on, while window 15 has only tones 1 and 3 on. FIG. 6B shows the FFT of the third symbol in the sequence. This symbol has all four tones on, their locations noted by dashed vertical lines. FIG. 6C shows the FFT of the 15th symbol in the sequence. This symbol only has tones 1 and 3 on.

The fidelity of symbol recovery is measured under different experimental conditions by sending randomized symbol sequences and comparing the recovered OOK data stream with the known sent patterns. Table II displays the directly measured bit-error rates for the various settings, that include higher or lower signal fields (representing a difference of 10 dB in signal power) and symbol periods of 1 ms and 100 ms. For the slower symbol rate, representing a data rate of 4 kbit/s, the bit-error rate is better than $8 \times 10^{-3}$ kbit/s.

The faster symbol rate, yielding a data rate of 40 kbit/s, has bit-error rates better than $6.1 \times 10^{-1}$ kbit/s.

TABLE II

A bit-error summary of the OOK scheme under different signal amplitudes and symbol periods. The signal-field amplitudes are listed in order for i = 1-4. The bit rate (BR) is the corresponding data rate. The bit-error ratio (BE) shows the fraction of bits that are incorrectly received and the bit-error rate (BER) is the number of bit errors per unit time.

| Signal fields (V/m) | Period (ms) | BR (kbit/s) | BE (%) | BET (kbit/s) |
|---|---|---|---|---|
| 0.11, 0.13, 0.93, 2.0 | 1 | 4 | 0.2 | $7.8 \times 10^{-3}$ |
| | 0.1 | 40 | 1.5 | $6.1 \times 10^{-1}$ |
| 0.36, 0.41, 2.9, 6.3 | 1 | 4 | 0.05 | $1.9 \times 10^{-3}$ |
| | 0.1 | 40 | 0.01 | $2.8 \times 10^{-3}$ |

This communication-reception demonstration highlights the power of simultaneous data reception of multiple signal carriers spanning from 12 to 116 GHz. Given the broader capability of the Rydberg sensor, which includes full amplitude or phase demodulation of many tones (potentially>100), it is possible to implement full quadrature-amplitude-modulated encoding for each signal tone, which would represent a complete orthogonal frequency-domain multiplexing protocol that can span multiple decades of the RF spectrum.

The apparatus 10, 400 and method 100 demonstrates how to utilize the multiresonant response profile of a Rydberg atomic sensor to detect a wide range of RF tones. This intrinsic multiband nature of atoms is likely to lead to additional sensing capabilities in the future, where it is difficult to achieve a similar ultrawide response profile using a sensor with a single resonant antenna. This shows a capability of such devices that cannot be easily mimicked by other physical platforms.

The fields that were experimentally detected are of order 104 times stronger than those detected for Global Positioning System triangulation. This is further governed by constraints of an EIT-based spectroscopy method and is not a limit inherent to atomic or quantum sensors. The experimental bandwidth roll-off near 6.1 MHz is governed by the EIT-based spectroscopy method. Alternative sensing schemes may improve this bandwidth, and therefore the multiplexing capacity, of Rydberg sensors used for ultra-wideband detection.

Appendix A: Resonant Versus Off-Resonant Two-Tone Response

Off-resonant RF couplings to the target Rydberg state are generally necessary to satisfy the conditions of Eq. (1). An interaction Hamiltonian of the optically probed target Rydberg state coupled to two Rydberg states via RF fields with Rabi frequencies $\Omega_a$, $\Omega_b$ and detunings $\delta_a$, $\delta_b$ is defined as:

$$H = \frac{1}{2}\begin{pmatrix} 0 & \Omega_a & \Omega_b \\ \Omega_a & 2\delta_a & 0 \\ \Omega_b & 0 & 2\delta_b \end{pmatrix}. \qquad (A1)$$

The eigenfrequencies are determined by diagonalizing this Hamiltonian. These eigenfrequencies represent the shifts of the coupled eigenstate energies from the bare Rydberg-target-state energy. It is these resonance shifts that are detected by performing EIT spectroscopy of the Rydberg target state (see the inset of FIG. 3A). By analyzing the eigenfrequencies under different RF detunings, it can be shown how multiple RF couplings to the same Rydberg state influence the observed spectroscopic shifts.

If both RF couplings are resonant with Rydberg transitions ($\delta_a$, $\delta_b$=0), the eigenfrequencies are the quadrature sum of both Rabi frequencies:

$$d\omega_{res} = \pm\sqrt{\Omega_a^2 - \Omega_b^2}. \qquad (A2)$$

This quadrature sum prevents general linear mapping of the individual couplings into the sensor baseband. While signal recovery is still possible with such a nonlinear response, the coupled shifts often lead to undesirable results. For example, if $\Omega_a >> \Omega_b$, the shift for field b (and any corresponding beat signal) is reduced by an additional factor of $\Omega_b/2\Omega_a$ and any beat in field b will not be independent of beats in field a. If both RF couplings are off resonant with Rydberg transitions ($\delta_a$, $\delta_b \neq 0$), the resulting eigenfrequencies show that the leading-order Stark shifts from each transition sum. If the simplifying assumption that $\delta_i >> \Omega_i$ is imposed and is expanded to lowest orders in $\Omega_i$, the Stark shift of the target state is:

$$d\omega_{off-res} = -\frac{\Omega_a^2}{4\delta_a} - \frac{\Omega_b^2}{4\delta_b} + \frac{\Omega_a^2\Omega_b^2}{16\delta_a\delta_b^2} + \frac{\Omega_a^2\Omega_b^2}{16\delta_a^2\delta_b}. \qquad (A3)$$

It is observed that the total Stark shift of each coupling adds linearly into the sensor baseband. By employing RF heterodyne detection for each tone, the signal response at each coupling is linearized, allowing for linear mapping of each signal tone into the sensor baseband. Changing the signs of the detunings also allows for the cancelation of large dc shifts due to the LOs.

If one RF coupling is resonant and the other is detuned ($\delta_a \neq 0$, $\delta_b$=0), one still observes linearly adding shifts from the two couplings. If it is again imposed that $\delta_a >> \Omega_a$ and expanded to lowest orders in $\Omega_a$, the new eigenfrequencies of the Hamiltonian can be observed to be:

$$d\omega_{mixed} = \pm\frac{\Omega_b}{2} - \frac{\Omega_a^2}{8\delta_a}. \qquad (A4)$$

In essence, one observes a combination of Autler-Townes splitting and an ac Stark shift. Combined with the above derivations, this shows that Stark shifts can satisfy Eq. (1), as long as no more than one RF coupling is resonant. This mode of operation could be used to increase the sensitivity of a single tone (by working on resonance), while maintaining wideband demodulation into the sensor baseband for many off-resonant couplings.

Appendix B: Experimental Details

The details of the experimental apparatus 400 of FIG. 3B are summarized here. Again, the embodiments herein are not restricted to the particular materials, brands, parameters, or configurations described below as the descriptions are merely a non-limiting experimental example. The homodyne probe field has a power of 3.6 µW and a $1/e^2$ radius of 410 µm. The corresponding Rabi frequency is $\Omega_p = 2\pi \times 3.1$ MHz. The probe-laser frequency is stabilized to a spectroscopy-referenced laser. When the probe laser is not being swept, its frequency is set to be single-photon resonant with the atomic transition for zero-velocity-class atoms ($\delta_p$=0). The coupling laser has a power of 500 mW and a $1/e^2$ radius of 380 μm. The corresponding Rabi frequency, averaged over the $|m_J|$=½, ³⁄₂ couplings, is $\Omega_c$=2π×4.9 MHz. The coupling laser frequency is stabilized to a ultra-low-expansion glass optical cavity. The coupling-laser frequency is set to be single-photon resonant with the atomic transition for zero-velocity-class atoms.

Balanced optical-homodyne detection is implemented using a Thorlabs® PDB450A detector set to a gain of $10^5$. The homodyne path phase is stabilized using an additional optical tone present on the probe laser, which is detected in heterodyne using a bias tee with both low- and high-pass port bandwidths of 32 MHz. The "dc" (homodyne) output of this bias tee is the source of all the data presented herein.

The data is acquired from the homodyne output in three primary ways: by USB-DAQ (see below), oscilloscope, and fast-Fourier-transform (FFT) spectrum analyzer. The first data-acquisition method is a sweep of the probe-beam frequency $\omega_p$ across its single-photon resonance, for a fixed $\omega_c$. Then, the resulting EIT output is recorded (e.g., FIG. 3D) at 500 kS/s using a National Instruments® USB 6343 data-acquisition system (USB-DAQ). The second method is to record time-domain voltage data using a Keysight® DSOX3024T oscilloscope. From this, the data can be presented directly (FIG. 4A) or transformed to the frequency domain in postprocessing (FIG. 4B) via FFT. The third method is to acquire power spectra directly using the FFT-spectrum-analyzer function of a multipurpose Liquid Instruments® Moku:Lab™ (0-250 MHz input bandwidth). Where appropriate, resolution bandwidths (RBWs) are quoted associated with measurements taken using this instrument.

The five microwave tones (Table I) are broadcast through free space onto the atomic sample. Each tone comprises of a pair of frequencies, signal and LO, that are combined prior to emission from the same horn. The horns 401-405 for tones 1-5 have gains of 20, 15, 25, 25, and 10 dBi, respectively. The frequencies for tones 1, 2, and 5 are generated by pairs of nearly identical frequency-synthesizer models; Rohde & Schwarz® SMB100®, Keysight® 8257N/D, and Stanford Research Systems™ SG386, respectively. The signal chains generating tones 3 and 4 begin with seed frequencies generated by two Windfreak Synth™ HD PRO synthesizers, each with two independent channels that are used for the signal and LO of the respective tone. Virginia Diodes™ RF multiplication modules are used to multiply the seed frequencies by a factor of 6 and provide amplification. The modules contain an internal voltage-controlled attenuator that is augmented with manual waveguide attenuators on the output to provide fine power adjustments. The LAB-SCRIPT™ software suite is used for experimental hardware control and timing.

Appendix C: Field Calibration

RF field amplitudes are calibrated at the atoms using the known spectroscopic response of the Rydberg target state. This response is calculated using the Floquet analysis. This model allows for arbitrary RF frequencies and properly accounts for Stark shifts from many Rydberg states simultaneously.

The LO-field amplitudes are first calibrated by measuring the amplitude of the Stark shift $d\omega_i$, with one LO field applied at a time, using a probe sweep measurement like those shown in FIG. 3D. Then, the Floquet model is used to determine the field amplitude necessary to produce that shift, accounting for the reduction in observed shift due to Doppler effects in a probe sweep and averaging the response between the nominally populated $|m_J|$=½, ³⁄₂ sublevels. The reported uncertainty in the field calibrations is due to statistical uncertainty in measuring $d\omega_i$ for each tone.

Figure 7:
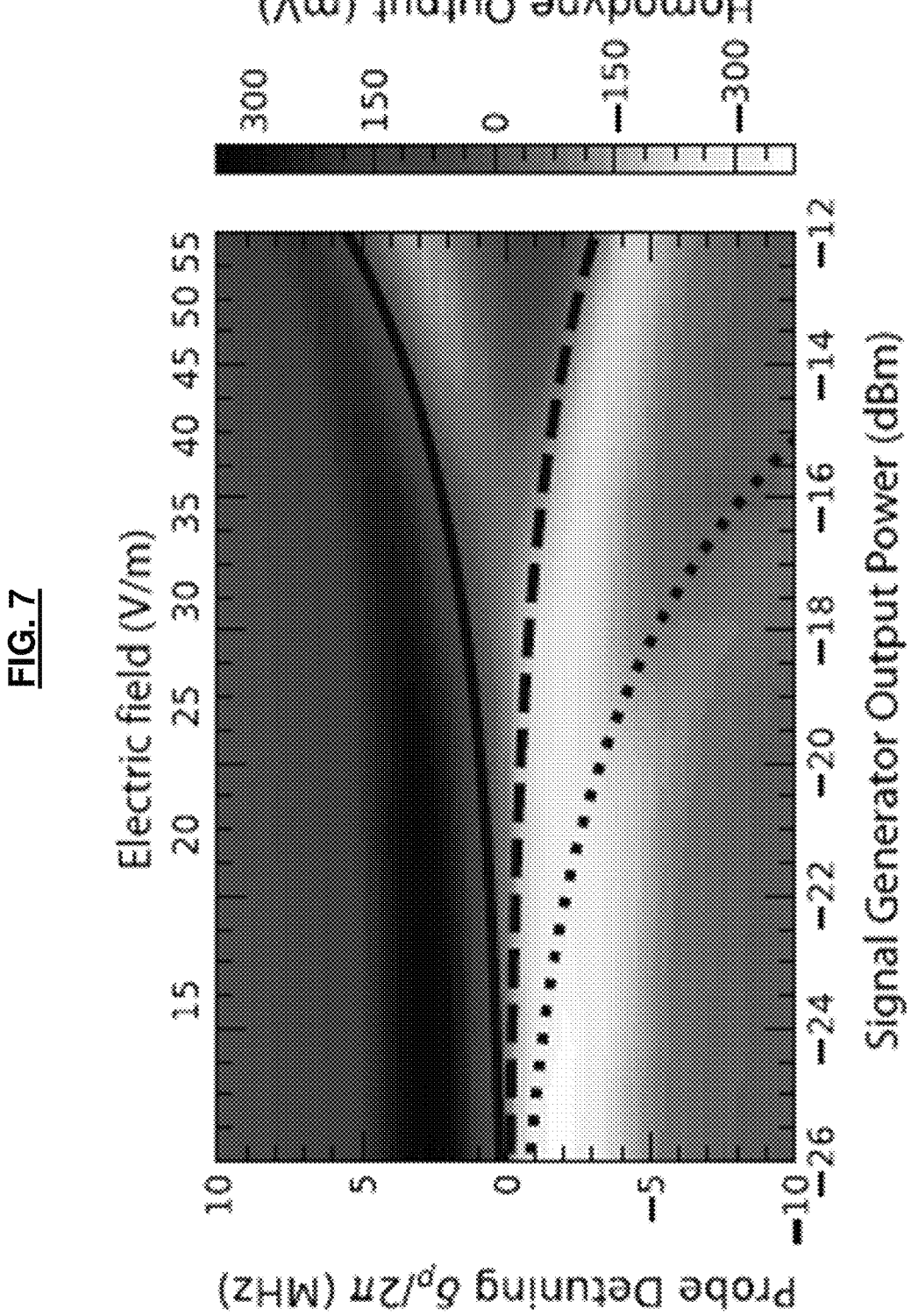
FIG. 7 is a graph illustrating an example calibration of the LO power for tone 5, according to an embodiment herein.

For tone 5, the carrier frequency is far enough from resonance that the response of the individual sublevels of the 56 $D_{5/2}$ state is more complicated than a simple global shift. To calibrate its field, a series of probe sweeps is taken with the LO power varied around its set point and match the Floquet model to the observed shifts. The result is shown in FIG. 7, where the solid, dashed, and dotted lines represent the theory predictions of the Stark shifts for the $|m_J|$=½, ³⁄₂, and ⁵⁄₂ sublevels. Due to the large detuning from the nearest Rydberg transition, the atomic sublevels do not shift in the same direction. The Floquet-theory model is matched to a range of LO RF powers as shown by the solid, dashed, and dotted lines, which track the zero crossing of the dispersive resonance for $|mJ|$=½, ³⁄₂, and ⁵⁄₂, respectively. The contrast of the peak for the $|m_J|$=⁵⁄₂ transition is much lower than the other two sublevels. This indicates that this sublevel is not as strongly populated, which is to be expected due to the linear polarizations of all the optical fields, which preclude direct dipole-allowed coupling into that sublevel from the 5 $P_{3/2}$ intermediate state. These data and the corresponding model fit further indicate that the observed broadening shown in FIG. 3D is largely attributable to the sublevel structure of the Rydberg states that we are probing.

Calibration of the signal-field amplitudes is more difficult, as the weak field amplitudes do not give resolvable Stark shifts on their own. For tones 1, 2, and 5, the signal tone is generated by a signal source identical to the LO signal source and the two tones are combined using resistive power combiners with a power imbalance better than 0.2 dB. As such, the signal-field calibration is extrapolated from the LO-field calibration based on the difference in set points of the signal generators. For tones 3 and 4, this process is not reliable, as the multiplication modules are not guaranteed to amplify the LO and signal tones evenly. To calibrate these tones, the beat amplitudes of tones 1 and 2 are measured on a spectrum analyzer and the derived LO and signal fields that are already calibrated are used to establish a conversion factor between the signal-field and the photodetector output voltage, employing Eq. (3). Then, this calibration factor is used to determine the signal-field amplitudes of tones 3 and 4 relative to the calibrated LO-field amplitudes.

Appendix D: Detector Bandwidth Correction

Figure 8:
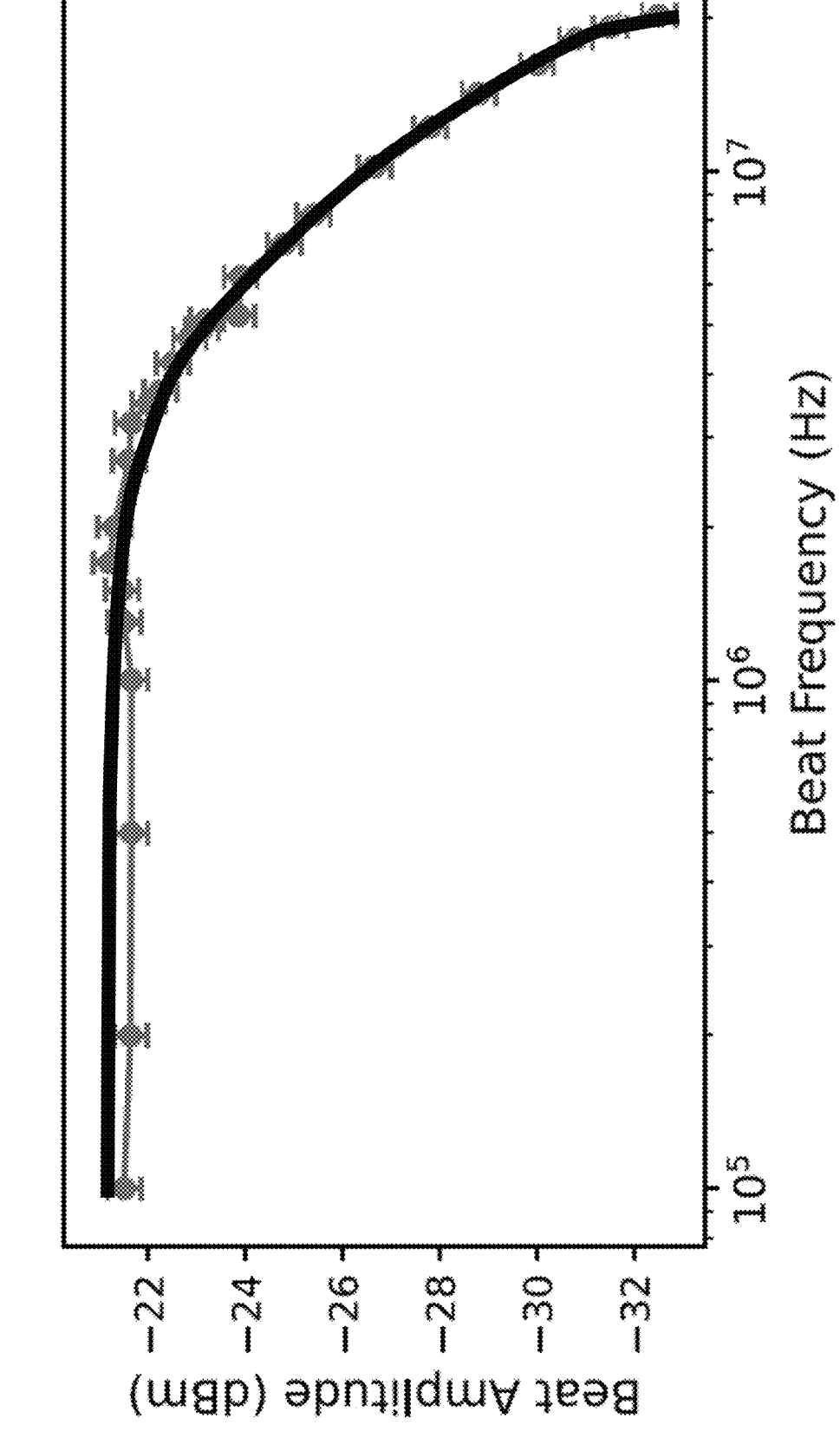
FIG. 8 is a graph illustrating photodetector response as a function of the optical beat frequency, according to an embodiment herein.

The bandwidth response of the sensor is limited, in part, by the photodetector bandwidth. An independently measured detector bandwidth curve is shown in FIG. 8, as well as a fit to a single-pole low-pass filter (solid thick line) with a 3-dB corner frequency at 6.30(14) MHz. It is obtained by tuning the applied EOM-modulation frequency of the probe light, generating an optical beat of constant magnitude. The error bars represent the measurement error. The fitted low-pass-filter response is used to remove the detector contribution to the data of FIGS. 5B and 5C, revealing the intrinsic atomic response.

The embodiments herein may be used as a wideband communications receiver for signals distributed over multiple decades of the RF spectrum. Moreover, the embodiments herein may also be used in communications applications wherever larger portions of the RF spectrum are being used. The multi-band Rydberg receiver is a method of using a Rydberg electric field sensor to simultaneously measure multiple signal RF fields. The embodiments herein can be used as a frequency-hopping receiver, wideband comms receiver, and for spectrum awareness.

By directly appropriate laser fields into a vapor cell (e.g., chamber 20) containing atoms 30 (for example rubidium) which couple the atomic ground state to a target Rydberg state via a multi-photon resonance (arrows 301, 302 in FIG. 3A), the transmission of the first laser field 45 can be monitored through the vapor cell (e.g., chamber 20) to observe coherent spectroscopic features that precisely measure the energy of the target Rydberg state. Applying RF fields to the Rydberg atoms 30 causes the energy of the target Rydberg state to change, and these changes are read out optically using the coherent spectroscopy. If an RF local oscillator field is applied that is detuned from a nearby atomic resonance (e.g., arrow 303a in FIG. 3A), the analysis becomes very sensitive to the amplitude and relative phase of a signal field that is close in frequency to the LO field (e.g., arrow 303b in FIG. 3A). When both fields are on, the optically-measured spectroscopic signal will have a beat imprinted onto it by the atoms that corresponds to the beat frequency between the signal and LO fields. If multiple LO fields are applied (potentially spanning multiple atomic resonances), many simultaneous beats in the optical signal can be observed. The Rydberg atoms 30 provide the demodulation of these beats into the same signal baseband. So long as it is assured that each signal beat adds linearly to the others (for example, by having all tones be off-resonant with the atomic transitions), the baseband signal will be a linear combination of all the input signal beat tones.

The total number of tones that can be measured is determined by the baseband bandwidth of the Rydberg sensor (approximately 10 MHz), the resolution bandwidth of the measurement (set by integration time), and the number of signal/LO tones that can be applied to the atoms without saturating the atomic signal (potentially of order 100). The sensor has the ability to simultaneously measure many RF tones without having to alter sensing elements (i.e., without changing antennas, input amplifiers, transmission lines, etc.). The embodiments herein solves a communications receiver problem of trying to measure multiple incident RF tones (potentially with widely varying wavelengths) without having to change sensor elements.

The multi-band, multi-tone Rydberg sensor/receiver provided by the embodiments herein employs lasers to create Rydberg atoms 30 that have a wideband, highly structured sensitivity to RF electric fields. By using multiple RF local oscillator fields, sensitive demodulation of many RF signal tones can be obtained, where each tone is demodulated into the same optically-detected baseband signal. The operational range spans from approximately 0 hertz to hundreds of terahertz, with potential to simultaneously detect over 100 distinct signal tones.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. An apparatus for simultaneous demodulation of radio frequency (RF) signals, the apparatus comprising:
   a chamber configured to contain a vapor comprising Rydberg atoms of at least one element;
   one or more RF synthesizers configured to generate a plurality of first input signals corresponding to a first electric field and a plurality of second input signals corresponding to a second electric field;
   a plurality of RF waveguides each coupled to the one or more RF synthesizers, wherein each RF synthesizer of the one or more RF synthesizers is coupled to a RF waveguide such that each RF waveguide is to guide its corresponding input signal at a frequency band that is distinct from frequency bands of the other RF waveguides;
   one or more lasers configured to provide one or more laser beams into the chamber, wherein the one or more laser beams are configured to provide atomic excitation of at least some of the Rydberg atoms of the at least one element in the vapor within the chamber to one or more Rydberg states, the one or more laser beams being further configured to provide one or more probe beams passing through the chamber to modulate the input signal; and
   one or more devices configured to detect the one or more probe beams, demodulate the input signal, and provide a simultaneously generated photo-detection output signal comprising information pertaining to the plurality of first input signals and the plurality of second input signals.

2. The apparatus of claim 1, wherein the at least one element comprises any of an alkali and alkaline earth metal vapor.

3. The apparatus of claim 1, wherein the plurality of first input signals comprise local oscillator (LO) signals and the plurality of second input signals comprise electric field signals.

4. The apparatus of claim 1, wherein the one or more devices comprises a photo-detector.

5. The apparatus of claim 1, wherein the one or more devices comprises a balanced optical-homodyne detector.

6. The apparatus of claim 1, wherein the plurality of first input signals comprise multiple RF signals having distinct frequencies from each other.

7. The apparatus of claim 5, wherein the one or more devices are configured to demodulate the multiple RF signals, and wherein each RF signal is demodulated into a same optically-detected baseband signal.

8. The apparatus of claim 1, wherein the one or more laser beams comprises a coupling laser beam.

9. The apparatus of claim 1, wherein each signal beat of the plurality of first input signals is to add linearly to other signal beats of the plurality of first input signals.

10. The apparatus of claim 9, wherein the Rydberg atoms are to provide a demodulation of each signal beat into a same signal baseband.

11. A method for performing simultaneous demodulation of radio frequency (RF) signals, the method comprising:
   generating, in a one or more RF synthesizers, a plurality of first input signals corresponding to a first electric field and a plurality of second input signals corresponding to a second electric field;
   guiding the combined input signal into a chamber that is configured to contain a vapor comprising Rydberg atoms of at least one element, wherein each RF synthesizer of the one or more RF synthesizers is coupled to a corresponding RF waveguide such that each RF waveguide is to guide its corresponding input signal at a frequency band that is distinct from frequency bands of the other RF waveguides;

providing one or more laser beams into the chamber, wherein the one or more laser beams are configured to provide atomic excitation of at least some of the Rydberg atoms of the at least one element in the vapor within the chamber to one or more Rydberg states, the one or more laser beams being further configured to provide one or more probe beams passing through the chamber to modulate the input signal;

detecting the one or more probe beams;

demodulating the input signal; and providing a simultaneously generated photo-detection output signal comprising information pertaining to the plurality of first input signals and the plurality of second input signals.

12. The method of claim 11, wherein the at least one element comprises any of an alkali and alkaline earth metal vapor.

13. The method of claim 11, wherein the plurality of first input signals comprise local oscillator (LO) signals and the plurality of second input signals comprise electric field signals.

14. The method of claim 11, comprising using a photo-detector to detect the one or more probe beams.

15. The method of claim 11, comprising performing balanced optical-homodyne detection of the one or more probe beams.

16. The method of claim 11, wherein the plurality of first input signals comprise multiple RF signals having distinct frequencies from each other.

17. The method of claim 16, comprising demodulating the multiple RF signals, wherein each RF signal is demodulated into a same optically-detected baseband signal.

18. The method of claim 11, wherein the one or more laser beams comprises a coupling laser beam.

19. The method of claim 11, wherein each signal beat of the plurality of first input signals is to add linearly to other signal beats of the plurality of first input signals.

20. The method of claim 19, wherein the Rydberg atoms are to provide a demodulation of each signal beat into a same signal baseband.

* * * * *